United States Patent [19]

Kurisaki et al.

[11] 4,341,593

[45] Jul. 27, 1982

[54] PLASMA ETCHING METHOD FOR ALUMINUM-BASED FILMS

[75] Inventors: Tetuo Kurisaki, Kawasaki; Yasuhiro Horiike, Tateno; Takashi Yamazaki, Kawasaki, all of Japan

[73] Assignees: Tokuda Seisakusyo, Ltd., Zama; Tokyo Shibaura Denki Kabushiki Kaisha, Kawasaki, both of Japan

[21] Appl. No.: 177,910

[22] Filed: Aug. 14, 1980

[30] Foreign Application Priority Data

Aug. 17, 1979 [JP] Japan ................................ 54/104032
Sep. 28, 1979 [JP] Japan ................................ 54/124207
Sep. 28, 1979 [JP] Japan ................................ 54/124209

[51] Int. Cl.³ ............................................. C23F 1/02
[52] U.S. Cl. .................................... 156/643; 156/345; 156/646; 156/656; 156/665; 204/192 E; 204/298; 252/79.1
[58] Field of Search ............... 156/643, 646, 656, 665, 156/345; 204/164, 192 E, 298; 252/79.1; 250/531; 427/38, 39

[56] References Cited

U.S. PATENT DOCUMENTS 3,994,793 11/1976 Harvilchuck et al. ......... 204/164 X
4,182,646 1/1980 Zajac .................................. 156/643

OTHER PUBLICATIONS

Preprint for 26th Applied Physics Meeting, 311 (1979) by K. Ueki et al. (Hitachi Ltd.).
Semiconductor Integrated Circuit Symposium ... 15th Lecture Articles (Electrochemical Association), 60 (1979) by H. Kinoshita et al Toshiba (NTIS), pp. 60-65.

Primary Examiner—William A. Powell
Attorney, Agent, or Firm—Oblon, Fisher, Spivak, McClelland & Maier

[57] ABSTRACT

A plasma etching method includes placing a workpiece including an aluminum-based film with an exposed portion on a cathode arranged in opposition to an anode. A plasma generating gas consisting of carbon tetrachloride and chlorine is introduced between the cathode and the anode at a pressure of 0.1 Torr or less. The ratio of the partial pressure of the chlorine to the total pressure of the plasma generating gas is 0.8 or less. Then, a high frequency electric power is applied between the cathode and the anode to generate a plasma from the plasma generating gas. The exposed portion of the aluminum-based film is etched by the plasma thus generated.

8 Claims, 13 Drawing Figures

F I G. 10
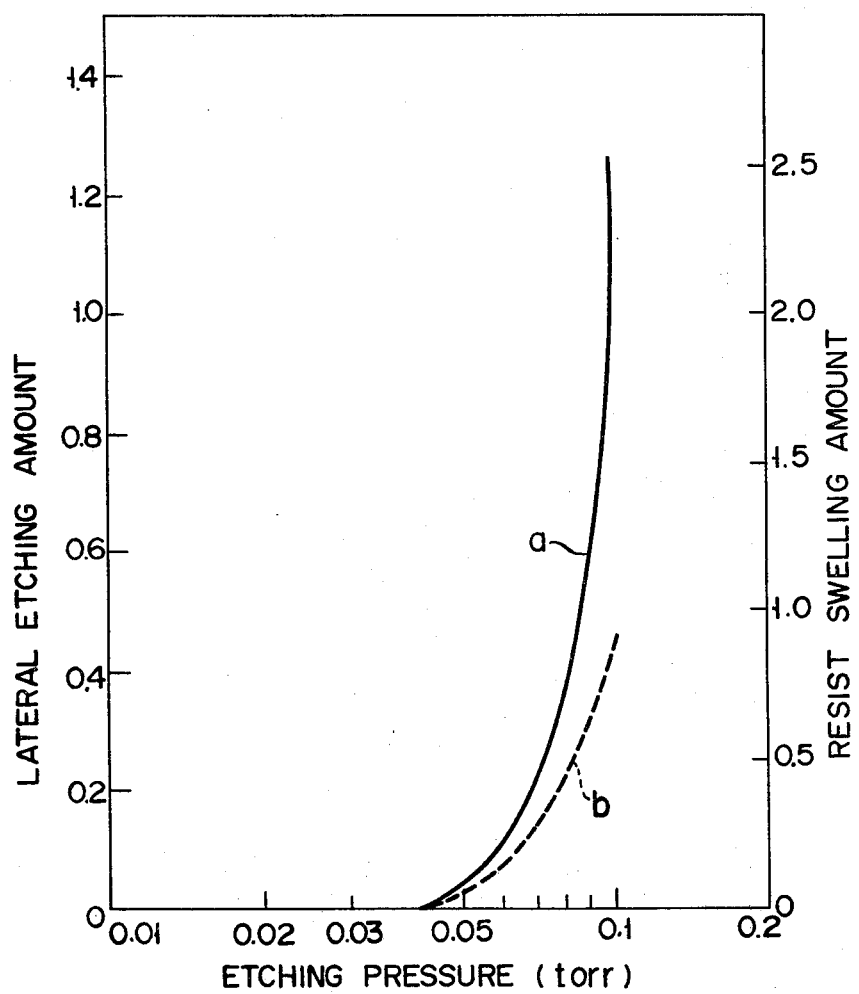

PLASMA ETCHING METHOD FOR ALUMINUM-BASED FILMS

The present invention relates to a plasma etching method and more particularly to a plasma etching method for aluminum-based films.

The plasma etching method using a fluorocarbon gas such as carbon tetrafluoride as a plasma generating gas is widely used for etching polycrystalline silicon films or silicon nitride films in the manufacture of LSIs. However, carbon tetrachloride is used as a plasma generating gas for etching aluminum films. The chlorine radicals or ions in the generated plasma react with aluminum to convert it to aluminum chloride. The aluminum chloride is then etched.

However, in the conventional plasma etching method using carbon tetrachloride alone as a plasma generating gas, the etching of aluminum is initiated several minutes to several tens of minutes after the plasma contacts the aluminum. This time lag results in various problems: control of the etching time is difficult, the resist tends to be etched before the aluminum etching can be initiated so that the resist pattern may deteriorate or disappear, more residue is produced and so on.

The conventional plasma etching method further presents practical problems since etching selectivity for aluminum over silicon or silicon oxide is relatively low. For example, when the thickness of an aluminum film formed on a silicon substrate or a silicon oxide film is not uniform, etching at thinner portions is completed before etching at thicker portions is completed. Thus, the silicon substrate or the silicon oxide film below these thinner portions is etched while the rest of the thicker portions are being etched. This might well lead to damage of elements.

Furthermore, with the conventional plasma etching method, etching tends to progress into portions of the aluminum film covered by a resist mask of a predetermined pattern (lateral etching) and the resist mask sometimes swells during aluminum etching. This presents problems in fine processing.

It is, therefore, an object of the present invention to provide a plasma etching method in which there is no time lag before initiating etching of aluminum-based films and by which aluminum-based films may be selectively etched with precision.

It is another object of the present invention to provide a plasma etching method according to which lateral etching of aluminum-based films may be reduced to minimum.

It is still another object of the present invention to provide a plasma etching method in which the resist film used as a mask during etching of an aluminum-based film does not swell.

To the above and other ends, the present invention provides a plasma etching method which comprises the steps of:

placing a workpiece including an aluminum-based film with an exposed portion on a cathode arranged in opposition to an anode;

charging a plasma generating gas consisting of carbon tetrachloride and chlorine gas at a pressure of 0.1 Torr or less between said anode and cathode, the ratio of the partial pressure of said chlorine gas to the total pressure being 0.8 or less;

applying a high frequency electric power between said anode and cathode for generating a plasma from said plasma generating gas; and etching said exposed portion of said aluminum-based film by said plasma.

In one aspect of the present invention, the aluminum-based film covers the silicon substrate or the silicon oxide film. In this case, the ratio of the partial pressure of the chlorine gas to the total pressure is generally 0.1 or more, preferably 0.2 or more and more preferably 0.6 or more. The plasma generating gas is preferably charged to a pressure of 0.01–0.06 Torr, and more preferably 0.02–0.06 Torr.

In another aspect of the present invention, the aluminum-based film is covered with a resist film of a predetermined pattern. In this case, the ratio of the partial pressure of the chlorine gas to the total pressure is generally 0.6 or less, preferably 0.2–0.45, and more preferably 0.3–0.35. The etching is performed at a cathode fall voltage of $-50$ V or less and preferably $-50$ V to $-220$ V.

This invention can be more fully understood from the following detailed description when taken in conjunction with the accompanying drawings, in which.

Figure 11:
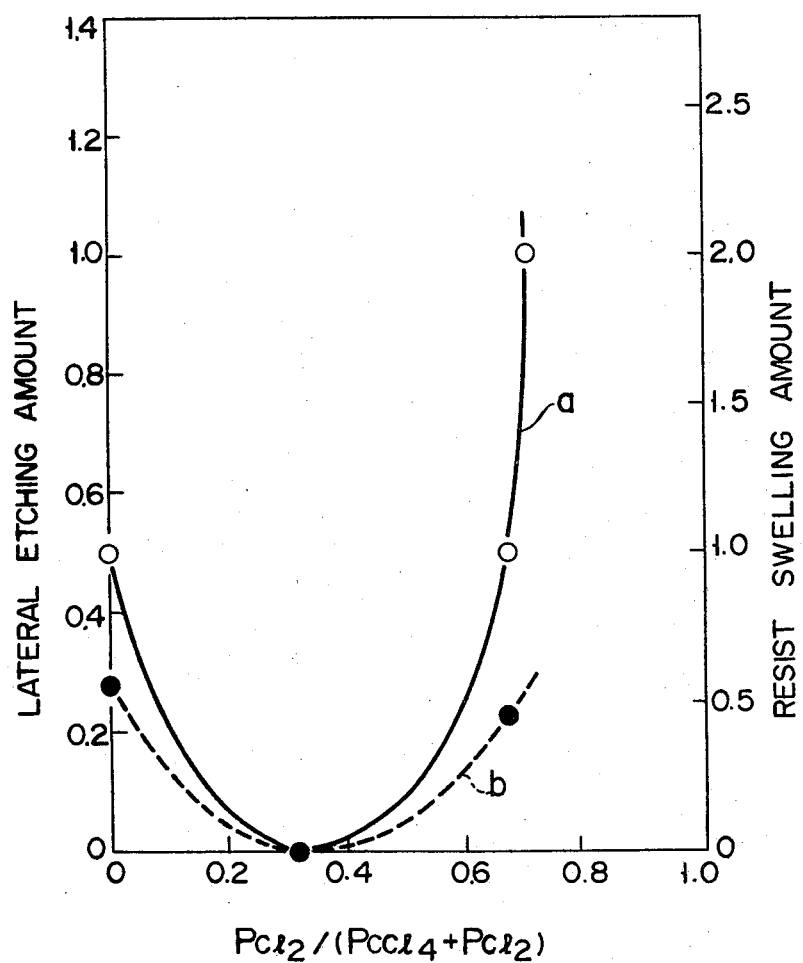

FIG. 10 is a graph showing the relation between the lateral etching amount of the aluminum film and the resist swelling amount, and the total pressure of the plasma generating gas used in the present invention; and FIG. 11 is a graph showing the relation between the ratio of the lateral etching amount of the aluminum film and the resist swelling amount, and the partial pressure of the chlorine gas of the plasma generating gas used in the present invention.

The present invention will now be described in more detail with reference to the accompanying drawings.

Figure 1:
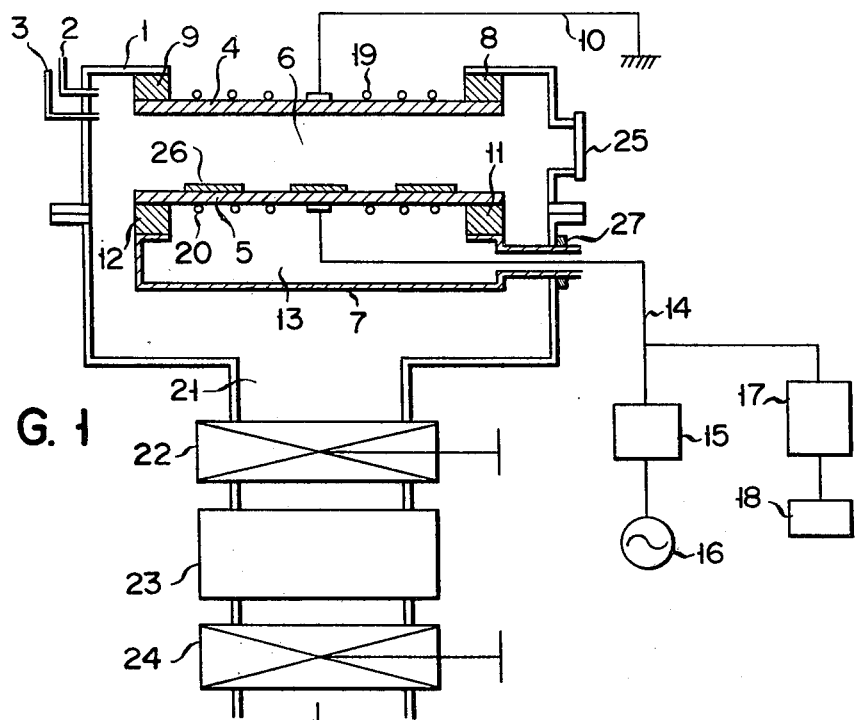
FIG. 1 is a schematic view of an apparatus to be used in the plasma etching method of the present invention.

FIG. 1 shows an apparatus used in the plasma etching method of the present invention. As shown in this figure, the plasma etching apparatus includes a sealed container 1 of, for example, a stainless steel which has an inlet port 2 for carbon tetrachloride and an inlet port 3 for chlorine gas. In this container 1 are disposed a plate anode 4 constituting part of the wall thereof and a plate cathode 5 arranged parallel to the anode. A plasma etching chamber 6 is formed between these electrodes 4 and 5.

The anode 4 is insulated from the container 1 by insulating bodies 8 and 9 of, for example, Teflon and is grounded through a lead wire 10. The cathode 5 is supported through insulating bodies 11 and 12 by a support plate 7 arranged in the container so as to form a space 13 between the cathode and itself. The cathode is connected through the space 13, the airtight part 27, the lead wire 14 and an external matching circuit 15 to a high frequency power source 16.

Water cooling pipes 19 and 20 for removing the heat generated during etching are disposed at the respective electrodes 4 and 5.

The container 1 further has a relatively large outlet port 21 for the plasma generating gas where two conductance valves 22 and 24 for controlling the internal pressure of the container 1 are disposed through a liquid nitrogen trap 23. The conductance valve 24 at the lower stream is connected to an exhausting means such as a diffusion pump, a Roots pump or a rotary pump.

A high frequency voltage detecting probe 17 is interposed between the cathode 5 and the matching circuit 15. This probe 17 drops the detecting voltage to 1/1,000 its original value and supplies it to a synchroscope 18. The inside of the etching chamber 6 can be observed through an observation window 25.

For performing the plasma etching method of the present invention using the etching apparatus of the type described above, a workpiece 26 having an aluminum-based film with an exposed portion, for example, an aluminum-based film which is formed on a silicon substrate or on a silicon oxide film formed on a silicon substrate and which is covered with a resist mask with a predetermined pattern is placed on the cathode. For the aluminum-based film, films of aluminum with several % of silicon or copper mixed therewith may also be used in place of films of pure aluminum.

After reducing the internal pressure of the container 1 to a pressure less than 0.01 Torr by an exhausting means, the carbon tetrachloride and the chlorine gases are charged into the container 1 through inlets 2 and 3, respectively. The internal pressure of the container 1 is adjusted by the conductance valves 22 and 24. When the liquid nitrogen trap 23 is used, the exhaustion is improved eight times in comparison with the case when it is not used and the damage to the exhaustion means may be prevented.

A high frequency electric power (RF) is applied from a power source 16 (generally from 100 W (0.12 W/cm$^2$) to 300 W (0.36 W/cm$^2$)) to the electrodes 4 and 5 while cooling these electrodes 4 and 5 by the cooling pipes 19 and 20. Then a glow discharge is effected, and a plasma is generated between both electrodes. The exposed portion of the aluminum-based film of the workpiece 26 is etched by this plasma.

Figure 2:
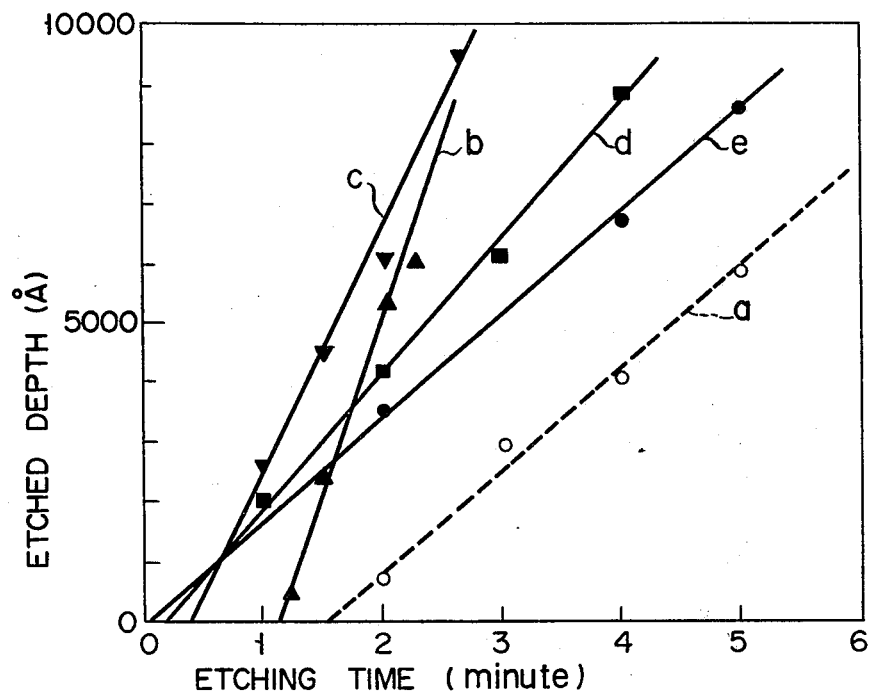
FIG. 2 is a graph showing the etching speed of an aluminum film by the plasma generating gas used in the present invention in comparison with that by conventional carbon tetrachloride.

The present invention is principally based on the finding that the time lag in the initiation of the etching of the aluminum film is significantly reduced when chlorine gas is added to carbon tetrachloride which has been conventionally used as the plasma generating gas. That is, the present inventors etched the aluminum films using carbon tetrachloride and a mixture of carbon tetrachloride and chlorine gas and measured the etching speed in each case. The results obtained are shown in FIG. 2. In the figure, the line a shows a case when etching was performed using the carbon tetrachloride alone under the conditions of 200 W in RF electric power and 0.04 Torr in pressure. Lines b, c, d and e show the cases when a mixture of carbon tetrachloride and chlorine gas was charged such that the ratio of the partial pressure of the chlorine gas to the total pressure was 15/40 ($PCl_2/PCl_2+PCCl_4$) and the etching was performed under the pressure of 0.1 Torr, 0.08 Torr, 0.06 Torr and 0.04 Torr, respectively by adjusting the pressure with a main valve 22.

As may be seen from FIG. 2, the time required before the initiation of the etching is far shorter with a mixture of the carbon tetrachloride gas and chlorine gas than with carbon tetrachloride gas alone as the plasma generating gas. This effect is even more pronounced when the pressure during the etching is reduced.

Based on this, the present inventors studied improvements in the etching selectivity for aluminum-based metals over silicon and silicon dioxide. As a result, it was found that when the ratio of the partial pressure of the chlorine gas to the total pressure ($PCl_2/(PCCl_4+PCl_2)$) is 0.8 or less and the total pressure during etching is 0.1 Torr or less, the etching selectivity for aluminum-based metals over silicon and silicon dioxide was improved. The ratio of the partial pressure of the chlorine gas to the total pressure is preferably 0.01 or more especially 0.2 or more, more preferably 0.4–0.8, and most preferably 0.6–0.8 for the purpose of improved selectivity. When the ratio of the partial pressure of the chlorine gas to the total pressure is 0.7 or less, and more preferably 0.6 or less, stable etching may be performed since the etching speed and the selectivity of the aluminum-based metals do not change abruptly.

The etching selectivity for aluminum-based metals is extremely good when the pressure during etching is 0.01 Torr or more, and more preferably 0.02–0.06 Torr.

The applied electric power does not provide much influence on the etching selectivity for aluminum-based metals, and similar results are obtained in the range of 100 W (0.12 W/cm$^2$) to 300 W (0.36 W/cm$^2$).

Figure 3:
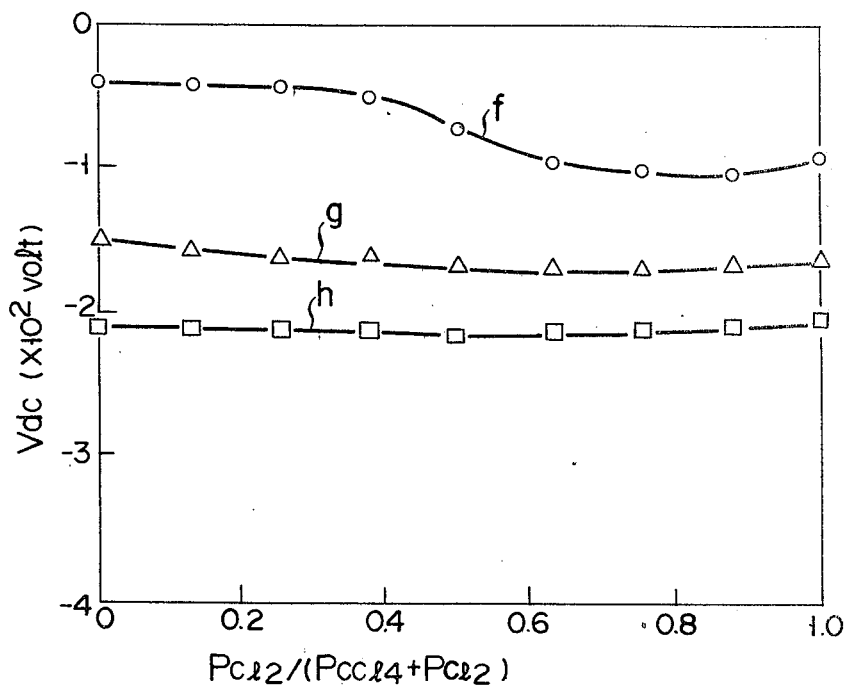
FIG. 3 is a graph showing the relation between the ratio of the partial pressure of the chlorine gas of the plasma generating gas used in the present invention and the cathode fall voltage.
Figure 5:
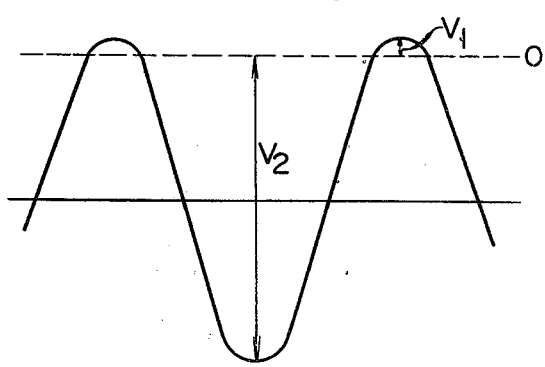
FIG. 5 is a view for explicating the cathode fall voltage.
Figure 4:
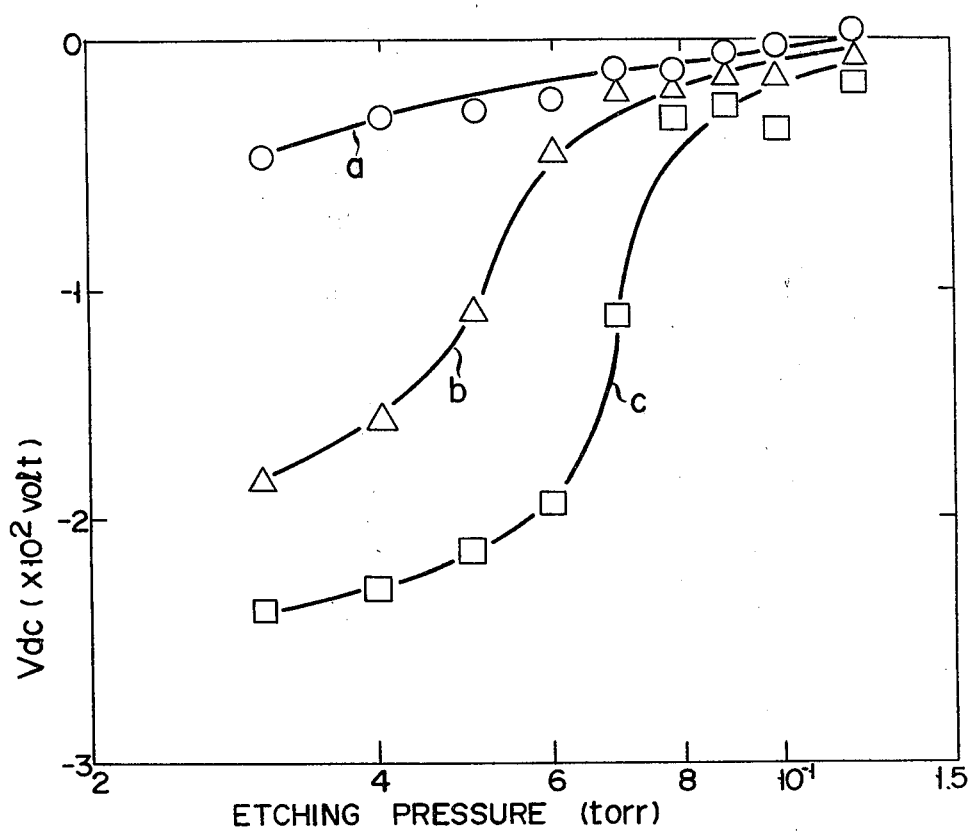
FIG. 4 is a graph showing the change of cathode fall voltage in relation to the change in total pressure of the plasma generating gas of the present invention.

Although the ratio of the partial pressure of the chlorine gas to the total pressure did not strongly influence the RF electric power and the cathode fall voltage, the etching pressure was found to be closely related to the cathode fall voltage (Vdc). For example, the relation between the partial pressure of the chlorine gas to the total pressure and Vdc was substantially constant as shown by the curves a, b and c in FIG. 3 when the etching pressure was constant and the RF electric power was 100 W (0.12 W/cm$^2$), 200 W (0.24 W/cm$^2$) and 300 W (0.36 W/cm$^2$). However, when the etching pressure was varied under similar RF electric power conditions while keeping the ratio of the partial pressure of the chlorine gas constant to be 0.015/0.04, Vdc also changed widely as shown by the curves a (RF=100 W), b (RF=200 W) and c (RF=300 W) shown in FIG. 4. The cathode fall voltage (Vdc) is generated by the drop in the potential at the cathode for attaining equilibrium when the electrons in the plasma flow at the positive half period and the positive ions flow at the negative half period to the cathode, which may otherwise be disturbed by the greater transfer force of the electrons. Thus, the cathode fall voltage may be correctly represented as $(V_1+V_2)/2$ as shown in FIG. 5, but is generally represented as $V_2/2$ since $V_1$ is small enough.

Figure 6A:
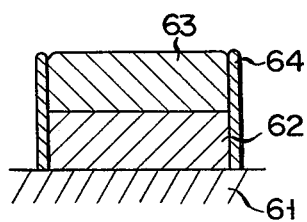
FIGS. 6A–6C are sectional views illustrating the state of a workpiece etched according to the present invention.
Figure 6B:
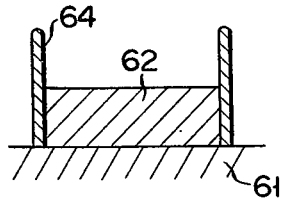
Figure 6C:
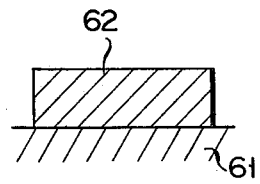

The present inventors have further studied the lateral etching and the swelling and deformation of the resist film in the etching of an aluminum-based film below a resist film using a plasma generating gas consisting of carbon tetrachloride gas and chlorine gas. It was learned that Vdc as well as the ratio of the chlorine gas partial pressure to the total pressure are closely related to these problems. When etching was performed at a ratio of the chlorine gas partial pressure to the total pressure of 0.6 or less and a cathode fall voltage of −20 V or less, the lateral etching was substantially decreased. For eliminating the lateral etching, the ratio of the chlorine gas partial pressure to the total pressure is preferably 0.2–0.45 and more preferably 0.3–0.35, and the cathode fall voltage is preferably −50 V to −220 V. When an aluminum-based film on a wafer 61 is etched using a resist mask 63 under the above-mentioned conditions, a residue 64 (this mainly consisted of Al according to an electron probe microanalysis) is deposited on the side faces of the resist film 63 and of the aluminum-based film 62 therebelow as shown in FIG. 6A. The lateral etching of the aluminum-based film is prevented by the existence of this residue 64. After the etching, the resist film 63 is etched by an oxygen plasma (FIG. 6B), and the remaining residue 64 is treated by a general resist remover at, for example, 110° C. for 5 minutes. Then a pattern of the aluminum-based film 62 with fine processing is obtained as shown in FIG. 6C. Thus, a pattern of, for example, 1μ in thickness and alternate lines and spaces each 1 μm in width is obtainable.

Accordingly, in order to substantially decrease the time lag of the etching initiating time of the aluminum-based film, to improve the etching selectivity for the aluminum-based film over silicon or silicon oxide, and to eliminate the lateral etching of the aluminum-based film and the swelling of the resist film, the etching is preferably performed under the condition that the ratio of the chlorine gas partial pressure to the total pressure is 0.2–0.6, the etching pressure is 0.1 Torr or less, and the cathode fall voltage is −50 V to −220 V.

The present invention will now be described in more detail with reference to the following examples. In the examples, the plasma etching apparatus shown in FIG. 1 was used.

EXAMPLE 1

Figure 7:
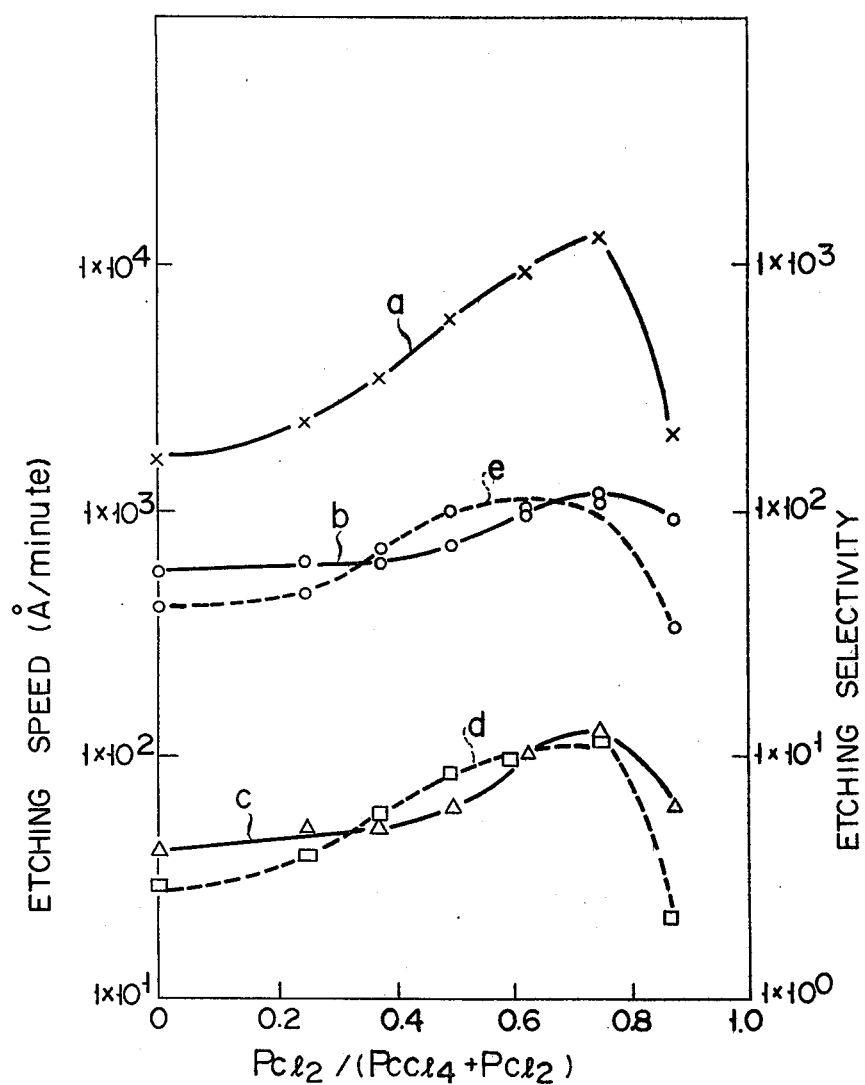
FIGS. 7 and 8 are graphs showing the etching characteristics of the plasma generating gas used in the present invention under different constant pressures, respectively.
Figure 8:
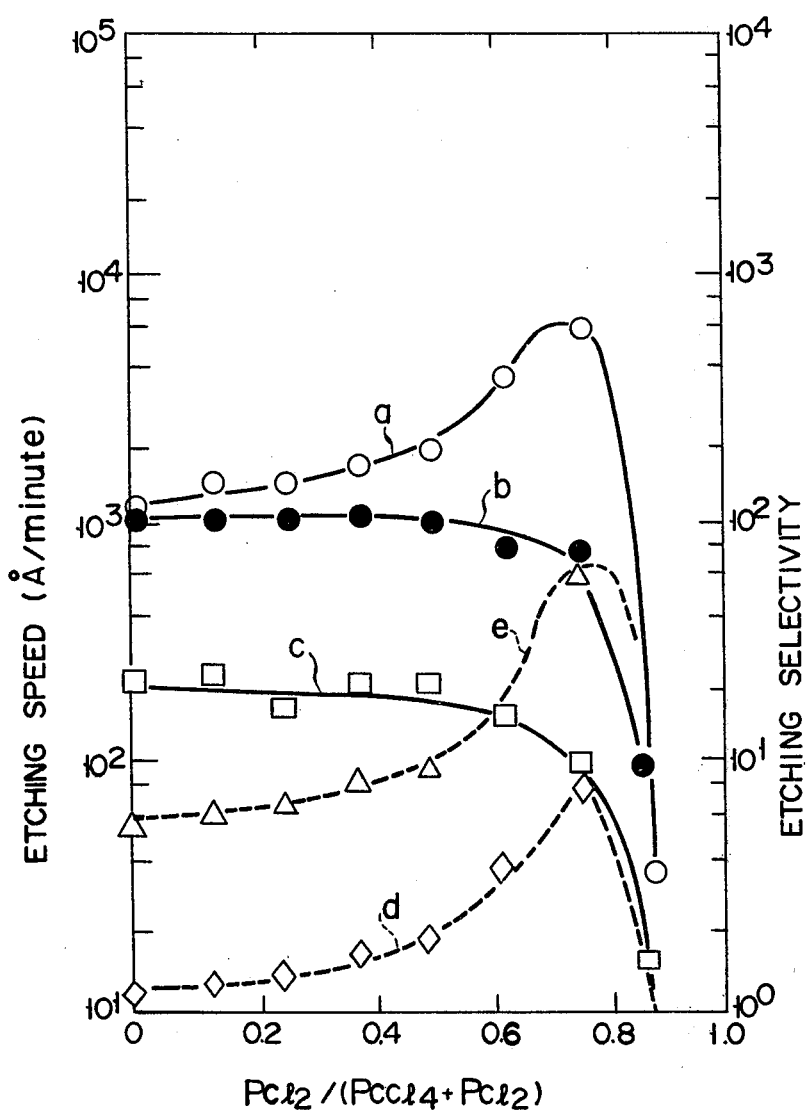

The etching pressure was kept constant at 0.1 and 0.04 Torr and the ratio of the chlorine gas partial pressure to the total pressure was varied. The etching speeds of the aluminum film, and silicon substrate, and the silicon oxide film were measured. The results are shown in FIG. 7 (0.1 Torr), and in FIG. 8 (0.04 Torr). In FIGS. 7 and 8, curve a shows the case of the aluminum film, curve b shows the case of the silicon substrate, and curve c shows the case of the silicon dioxide film. Curves d and e show the etching selectivity for aluminum over silicon and for aluminum over silicon oxide.

It is seen from FIGS. 7 and 8 that the etching selectivity for aluminum with silicon and silicon oxide is improved when the chlorine gas partial pressure ratio is 0.8 or less. The aluminum film was not etched very much when the chlorine gas partial pressure ratio was 0.9.

EXAMPLE 2

Figure 9:
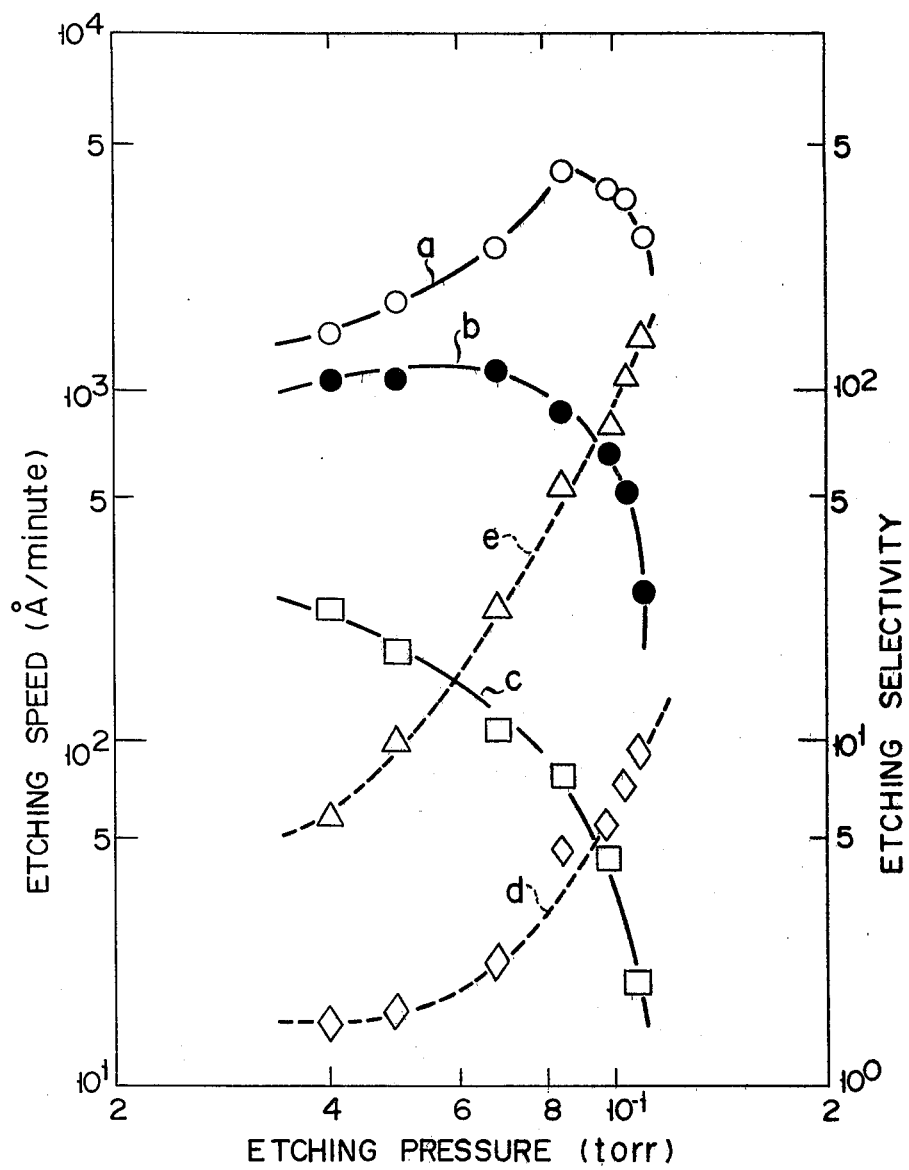
FIG. 9 is a graph showing the etching characteristics of the plasma generating gas used in the present invention under different pressures.

The chlorine gas partial pressure ratio was kept constant at 0.015/0.04 and the etching pressure was changed (0.04, 0.05, 0.07, 0.085, 0.1, 0.11 and 0.12 Torr). The etching speeds of the aluminum film, the silicon substrate, and the silicon oxide film were measured. The results are shown in FIG. 9. In this figure, curve a shows the case for the aluminum film, curve b shows the case for the silicon substrate, and curve c shows the case for the silicon oxide film. The curves d and e are the etching selectivities for Al/Si and Al/SiO$_2$.

It is seen from FIG. 9 that the etching selectivity of the aluminum film is improved when the etching pressure is 0.1 Torr or less. The aluminum film was not etched very much when the etching pressure was 0.15 Torr.

EXAMPLE 3

The chlorine gas partial pressure ratio was kept constant at 0.015/0.04, a high frequency electric power of 200 W was used, and the etching pressure was charged for etching the aluminum film below the resist mask. The lateral etching of the aluminum film and the resist swelling were measured. The results are shown in FIG. 10. In the figure, curve a shows the lateral etching and curve b shows the resist swelling. Lateral etching exceeding the thickness of the aluminum film was observed in the aluminum film when the etching pressure was more than 0.1 Torr. When these results are compared with those in FIG. 4, it is seen that the cathode voltage drop is preferably −20 V or less.

EXAMPLE 4

The etching pressure was kept constant at 0.04 Torr, a high frequency electric power of 200 W was used, and the chlorine gas partial pressure ratio was changed. The lateral etching of the aluminum film below the resist film and the swelling of the resist were measured. The results are shown in FIG. 11. In this figure, curve a shows the lateral etching of the aluminum film and curve b shows the resist swelling.

It is seen from FIG. 11 that, if the chlorine gas partial pressure ratio is 0.6 or less, the lateral etching and the resist swelling are significantly more reduced than the case when carbon tetrachloride gas alone is used.

What we claim is:

1. A plasma etching method comprising the steps of:
   placing a workpiece including an aluminum-based film with an exposed portion on a cathode arranged in opposition to an anode;
   charging a plasma generating gas consisting of carbon tetrachloride and chlorine gas at a pressure ranging from 0.01 to 0.06 Torr between said anode and cathode, the ratio of the partial pressure of said chlorine gas to the total pressure being 0.8 or less;
   applying a high frequency electric power between said anode and cathode to generate a plasma from said plasma generating gas; and
   etching said exposed portion of said aluminum-based film by said plasma.

2. The method as claimed in claim 1 wherein said chlorine gas partial pressure ratio is 0.1–0.8.

3. The method as claimed in claim 2 wherein said chlorine gas partial pressure ratio is 0.2–0.8.

4. The method as claimed in claim 1 wherein said chlorine gas partial pressure ratio is 0.6 or less.

5. The method as claimed in claim 4 wherein said chlorine gas partial pressure ratio is 0.2–0.45.

6. The method as claimed in claim 4 wherein etching is performed at a cathode fall voltage of −50 V or less.

7. The method as claimed in claim 6 wherein etching is performed at a cathode fall voltage of −50 V to −220 V.

8. A plasma etching method, consisting essentially of:

placing a workpiece including an aluminum-based film with an exposed portion on a cathode arranged in opposition to an anode;

charging a plasma generating gas consisting of carbon tetrachloride and chlorine gas at a pressure of 0.01 to 0.06 Torr between said anode and cathode, the ratio of the partial pressure of said chlorine gas to the total pressure being 0.8 or less;

applying a high frequency electric power between said anode and cathode to generate a plasma from said plasma generating gas; and etching said exposed portion of said aluminum-base film by said plasma.

* * * * *